United States Patent [19]

Sankaranarayanan et al.

[11] Patent Number: 5,146,480
[45] Date of Patent: Sep. 8, 1992

[54] SAMPLING AN ANALOG SIGNAL VOLTAGE USING FILL AND SPILL INPUT IN CHARGE TRANSFER DEVICE

[75] Inventors: Laksmi N. Sankaranarayanan; Anton H. Rensink, both of Eindhoven, Netherlands

[73] Assignee: U.S. Philips Corporation, New York, N.Y.

[21] Appl. No.: 688,015

[22] Filed: Apr. 19, 1991

[30] Foreign Application Priority Data

May 23, 1990 [GB] United Kingdom ............... 9011507

[51] Int. Cl.$^5$ ..................... G11C 19/28; H01L 29/78
[52] U.S. Cl. ........................................ 377/60; 357/24
[58] Field of Search ................. 357/24; 377/57-63

[56] References Cited
U.S. PATENT DOCUMENTS

| | | | |
|---|---|---|---|
| 3,986,198 | 10/1976 | Kosonocky | 357/24 |
| 4,112,456 | 9/1978 | Lampe et al. | 357/24 |
| 4,178,519 | 12/1979 | Engeler et al. | 357/24 |
| 4,606,060 | 8/1986 | Klar et al. | 377/60 |
| 4,890,307 | 12/1989 | Imai et al. | 377/60 |

Primary Examiner—Gene M. Munson
Attorney, Agent, or Firm—Bernard Franblau

[57] ABSTRACT

A charge coupled device for sampling an analog signal voltage. If charge is inputted to a charge coupled device by the so-called phase-referred input method, a minority charge carrier source region (10) in a semiconductor body (1) is clocked in phase with a charge transfer gate (6) so that a metering potential well formed under a metering electrode (4) is alternately filled via a d.c. gate (5) with carriers to a predetermined level and then surplus carriers are drained back via the d.c. gate and the remainder exit via the transfer gate. This mechanism tends to degrade at high frequencies and, in order to improve the high frequency performance, a very short further gate (20) is provided between the d.c. gate and the metering well. This further gate is clocked in antiphase to the source region (10) and the transfer gate (6) so that it creates a rising potential barrier when the surplus carriers are being drained back, thereby isolating the metering well from the source (10) and the d.c. gate comparatively early in the complete draining process than would otherwise occur.

6 Claims, 3 Drawing Sheets

SAMPLING AN ANALOG SIGNAL VOLTAGE USING FILL AND SPILL INPUT IN CHARGE TRANSFER DEVICE

BACKGROUND OF THE INVENTION

One aspect of this invention relates to apparatus for sampling an analog signal voltage to provide charge packets the sizes of which are representative of successive samples. This apparatus comprises a semiconductor substrate of a given conductivity type within and adjacent a surface of which a charge carrier source region of the opposite conductivity type is provided and a channel region for transporting charge carriers from said source region is defined. The channel region has the given or the opposite conductivity type and has a plurality of gate electrodes insulatingly overlying it for controlling the charge carrier transport, said electrodes including a first gate electrode for forming a metering potential well within said channel region, a second gate electrode for forming a first potential barrier within said channel region between said metering potential well and said source region, and a third gate electrode for controlling the transfer of charge packets from said metering potential well towards an output. The apparatus further comprises an input for said analog signal voltage, which input is coupled to said first gate electrode, and a control signal generator arrangement coupled to said source region and to said first, second and third gate electrodes for applying a bias voltage in conjunction with said analog signal voltage to said first gate electrode so as to create said metering potential well, for applying a bias voltage to said second gate electrode so as to create said first potential barrier, and for applying clock signals having substantially the same phase to both said source region and said third gate electrode to control the potentials of the source region and the third gate electrode between (a) values at which said metering potential well will be filled over said first potential barrier with charge carriers from said source region to a level determined by the potential of said source region and said third gate electrode will create a second potential barrier acting to prevent said charge carriers from leaving said metering potential well, and (b) values at which said first potential barrier will act to prevent charge carriers entering the metering potential well from said source region and said third gate electrode will no longer create any potential barrier acting to prevent charge carriers leaving said metering potential well.

Another aspect of this invention relates to a method of sampling an analog signal voltage to provide charge packets the sizes of which are representative of successive samples, in which method a charge carrier source region of a given conductivity type provided within and adjacent a surface of a semiconductor substrate of the opposite conductivity type and a plurality of gate electrodes which insulatingly overly a charge carrier transport channel region of the given or the opposite conductivity type defined within said substrate adjacent said surface for controlling the transport of charge carriers from said source region through said channel region are controlled in a manner such that a metering potential well the depth of which depends on said analog signal voltage is created in said channel region by means of a first said gate electrode, a first potential barrier is created in said channel region between said well and said source region by means of a second said gate electrode, a second potential barrier is created in said channel region adjacent said metering potential well by means of a third said gate electrode, and said source region and said third gate electrode are controlled by clock pulses having substantially the same phase so that alternately (a) said metering potential well is filled over said first potential barrier with charge carriers from said source region to a potential level determined by the then potential of said source region while the second potential barrier is maintained sufficiently high to prevent such carriers from the source region from leaving the well, and (b) charge carriers are drained back from the well into the source region over the first potential barrier and, substantially simultaneously, the second potential barrier is lowered to allow charge carriers remaining in the well to leave the well towards an output.

Such an apparatus and method is known, for example, from an article entitled "Phase-Referred Input: A Simple New Linear C.C.D. Input method" by D. V. McCaughan and J. G. Harp in "Electronics Letters" Vol. 12 no. 25 (Dec. 9th, 1976) at page 682. This known apparatus and method employs a so-called "fill and spill" input method and, as will be evident from the title of the article, is used to input charge to a charge coupled device (CCD). An advantage of this known apparatus and method, as compared with other apparatuses and methods employing "fill and spill" input methods, is that it needs no special clock signals. The clock signals applied to the source region and the third gate electrode can be one and the same (albeit possibly with a d.c. bias on one relative to the other) and have a simple 1:1 mark-to-space ratio, whereas the bias voltages applied to the first and second gate electrodes can each be a simple d.c. bias.

The known apparatus is shown schematically in FIG. 1A of the accompanying diagrammatic drawings, FIGS. 1B, 1C and 1D illustrating various stages in the ideal operation thereof.

In FIG. 1A a semiconductor body or substrate 1, which is shown in a schematic cross-sectional view, has a major surface 2 on which is provided an electrically insulating layer 3. On the layer 3 are provided first, second and third gate electrodes 4, 5 and 6, respectively, so that these electrodes overlie respective portions of a charge carrier transport channel region 7 defined at the surface 2 of the substrate 1 which is of a given conductivity type, for example, p-type. A charge carrier source region 10 of the substrate, adjoining the region 7, is of the opposite conductivity type, i.e. n-type in the present example, and provides the charge carriers transported by the region 7. A clock signal generator 11 supplies clock signals having a positive polarity (relative to the p-type region of the substrate 1) from an output 18 to the electrode 6 and the region 10. A d.c. voltage source 12 supplies a positive d.c. bias (relative to the p-type region of the substrate 1) from an output 23 to the electrode 5. Generator 11 and source 12 together constitute a control voltage generator arrangement 13. An output 24 of an analog input signal source 14 supplies a positive-polarity input signal to electrode 4 relative to electrode 5.

FIG. 1B illustrates the situation when the output of clock signal generator 11 is low (least positive). The positive potentials applied to the electrodes 4 and 5 result in the creation of a metering potential well 8 in the portion of region 7 under electrode 4 and a first potential barrier 9 in the portion of region 7 under electrode 5 respectively. The top of the barrier 9 corresponds to a potential $V_{ref}$ (determined by the output voltage of bias voltage source 12) and the bottom of well 8 corresponds to a potential $V_{ref}+V_{sig}$ (determined by the output voltage of source 12 in conjunction with the output voltage of analog signal source 14). The potential $V_{10}$ of n-type region 10 is less positive than $V_{ref}$ so that the metering potential well 8 under electrode 4 is filled over the first potential barrier 9 under electrode 5 with minority charge carriers (electrons in the present case, these being denoted by the shaded area 16) from the region 10, the filling being to the level $V_{10}$. It will be noted that the potential $V_{15}$ of the top of a second potential barrier formed under electrode 6 at this time is $V_x$ less positive than the level $V_{10}$, so that this potential barrier acts to prevent electrons from leaving region 10.

Ignoring for the moment the dashed line 17 therein, FIG. 1C illustrates the situation at a point on the transition of the output signal of clock-signal generator 11 from low to high, more particularly the situation obtaining when the potential $V_{10}$ of the region 10 has increased to that ($V_{ref}$) of the top of the potential barrier 9 under electrode 5. All the electrons previously lying over this barrier have spilled back into the region 10, as have sufficient of those electrons previously in the metering potential well 8 under electrode 4 to leave the metering potential well filled to the level $V_{ref}$. The number of electrons remaining in the metering potential well 8 is therefore representative of the value $V_{sig}$ of the output signal of source 14 at the relevant instant. It will be noted that the potential $V_{15}$ of the top of the second potential barrier 15 is still $V_x$ less positive than the level $V_{10}$, so that barrier 15 still acts to prevent electrons from leaving the well 8.

FIG. 1D illustrates the situation when the output of clock signal generator 11 has become high (most positive). The potential $V_{15}$ of the top of the "barrier" 15 formed under electrode 6 is now sufficiently positive to ensure that this barrier no longer acts to prevent any electrons present in well 8 from leaving this well. All the electrons previously in the metering potential well 8 have drained into the region under electrode 6. (It is assumed for the purposes of the present discussion that a further potential barrier is present to the right of this region so that a potential well now exists under electrode 6. This may or may not be the case in practice, depending on the technique adopted for transferring charge from the region under electrode 6). Thus, a charge packet the size of which is representative of the value of the output voltage of source 14 at the instant to which FIG. 1C corresponds is now present in the portion of the region 7 under electrode 6, as required, and the various operations set forth above can now be repeated. It will be noted that, in the situation illustrated in FIG. 1D, the potential of the region 10 is more positive than the potential $V_{ref}$ of the top of the first potential barrier 9, so that barrier 9 acts to prevent electrons from entering the metering well 8 from the region 10 at this time.

The difference $V_x$ between the potentials $V_{15}$ and $V_{10}$ may be obtained by virtue of the particular construction adopted for the body 1 and its associated electrodes etc., or may be obtained by including a d.c. voltage source (not shown) in the connection from electrode 6 to region 10 in FIG. 1A.

As mentioned previously, FIGS. 1B, 1C and 1D illustrate ideal situations. Such ideal situations can in fact only be approached if sufficient time is available for a successful transition from each stage to the next because each transition involves the movement of electrons between regions of the body or substrate 1, and electrons, of course, do not have infinite mobilities. Making available such sufficient time involves imposing a limit on the steepness of the relevant edges of the clock pulses produced by generator 11 and hence on the maximum frequency thereof. If this is not done then inaccurate sampling of the output voltage of source 14 results, as is pointed out in, for example, the paragraph bridging columns 1 and 2 of U.S. Pat. No. 4,178,519. It is an object of the present invention to mitigate this disadvantage.

SUMMARY OF THE INVENTION

According to one aspect of the invention, apparatus as defined in the first paragraph is characterized in that said plurality of gate electrodes includes a fourth gate electrode for forming a third potential barrier within said channel region between said metering potential well and said first potential barrier, and in that said control signal generator arrangement is coupled to said fourth gate electrode for applying a clock signal thereto substantially in antiphase to the clock signals applied to the source region and the third gate electrode to control the potential of said fourth gate electrode between a first value at which the third potential barrier is at least as low as said first potential barrier and a second value at which the third potential barrier is comparatively high and is higher than said first potential barrier.

It has now been recognised that a major cause of the above-mentioned inaccurate sampling occurring in the known apparatus when the rising edges of the clock pulses are relatively steep is that in such a situation electrons start to flow into the part of substrate region 7 (FIG. 1A) lying under the electrode 6 while those in the part of region 7 under electrode 5 are still capable of flowing either into the part under region 10 or the part under electrode 4. Thus, for example, in the situation illustrated in FIG. 1C the potential profile under the region 10 and the electrodes 5,4 and 6 will not in practice be a constant $V_{10}$ under region 10 and electrodes 5 and 4 and a constant $V_{15}$ under electrode 6 but will instead approximate to that indicated by the dashed line 17. This means that the total charge flowing into the part of region 7 under electrode 6 as the clock pulse goes from low to high is not determined by the value of the voltage on electrode 4 at a particular instant of time (the instant when pinch-off occurs at the junction between the part of region 7 under region 10 and the part of region 7 under electrode 5) but rather by the average of said voltage over the period of time from the instant at which charge starts to flow into the part of region 7 under electrode 6 to the instant at which said pinch-off occurs. This in effect limits the high-frequency response of the known apparatus. What is required is some means of substantially isolating the part of region 7 under electrode 4 from the part under electrode 5 comparatively early in the clock pulse rise time, i.e. before a substantial amount of charge has spilled into the part of region 7 under electrode 6. It has furthermore been recognised that this can be achieved by providing a clocked fourth gate electrode in the manner set forth.

The length of the fourth gate electrode is preferably small compared with, for example less than one-third of, the lengths of the first and second gate electrodes, and is preferably made as small as the technology employed allows in order to minimise the amount of charge which is spilled forwards and backwards from above the third potential barrier each time the height of this barrier increases.

The third gate electrode may constitute the first electrode of a two-phase charge transfer gate electrode structure, respective sets of the remaining electrodes of which are connected to said third gate electrode and to said fourth gate electrode for receiving the corresponding clock signals. Thus the number of individual clock signals and corresponding connections required when a transfer gate electrode structure is provided can be minimised.

According to another aspect of the invention a method as defined in the second paragraph is characterised in that a third potential barrier is created between the first barrier and the well by means of a fourth said gate electrode and the fourth gate electrode is controlled by clock pulses so that the third barrier is alternately raised and lowered substantially simultaneously with the lowering and raising of the second barrier, the height of said third barrier being at least as low as said first potential barrier when said third barrier is in its lowered state and being higher than said first potential barrier when said third barrier is in its raised state.

BRIEF DESCRIPTION OF THE DRAWING

Embodiments of the invention will now be described, by way of example, with reference to the accompanying diagrammatic drawings, in which.

DESCRIPTION OF THE PREFERRED EMBODIMENTS

Figure 1A:
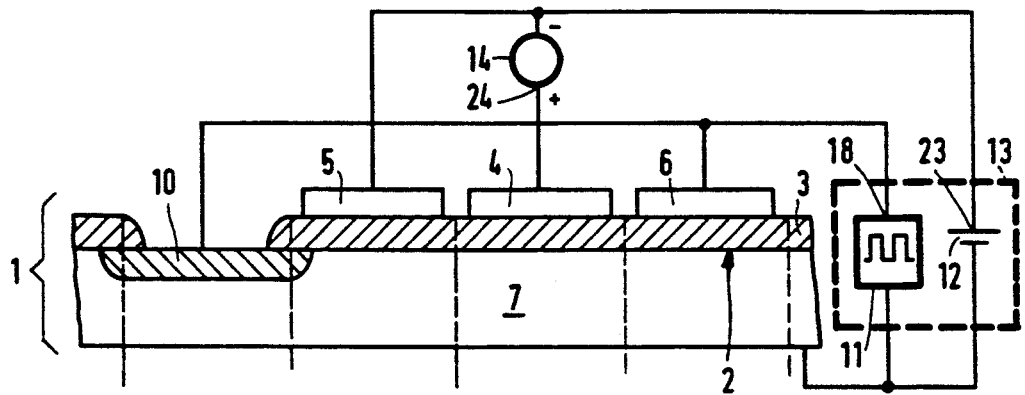
FIGS. 1A through 1D illustrates a known apparatus and stages during its operation, as previously referred to, FIG. 2 correspondingly illustrates a first embodiment of the invention and stages during its operation.
Figure 1B:
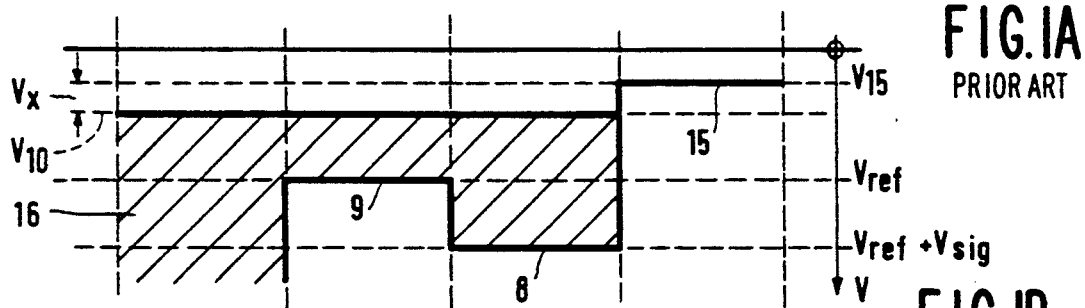
Figure 1C:
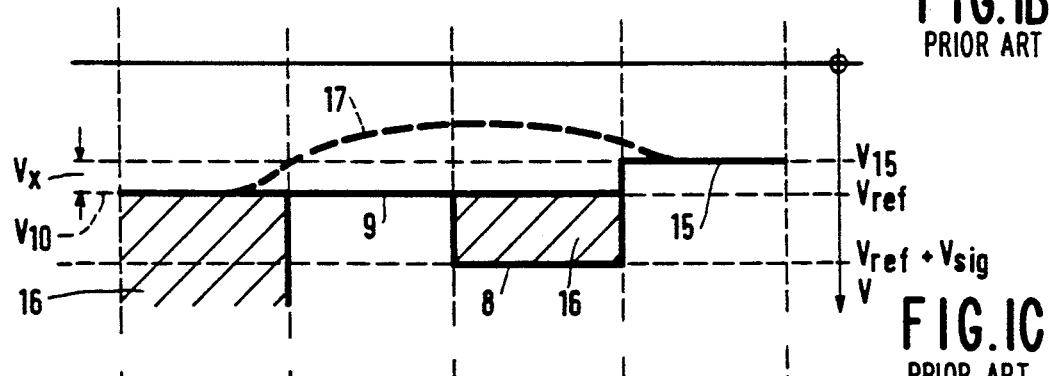
Figure 1D:
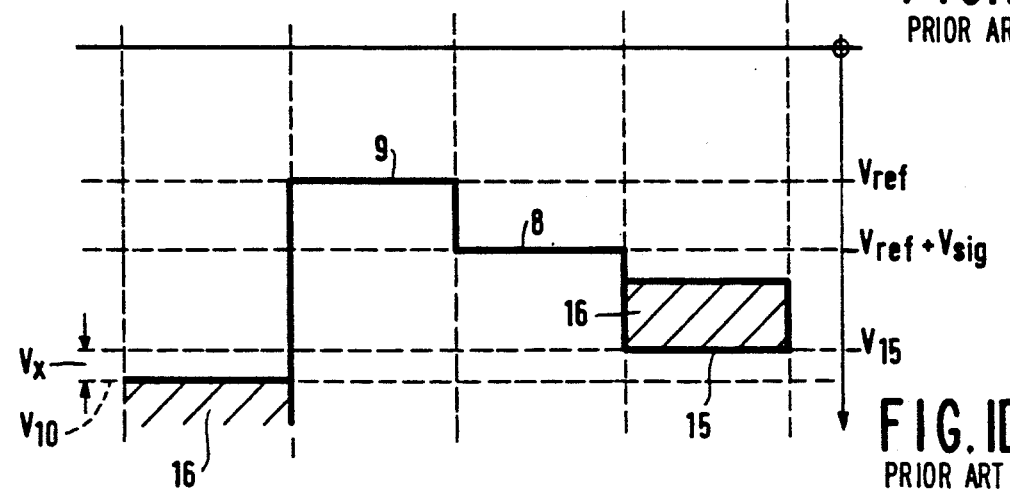
Figure 2:
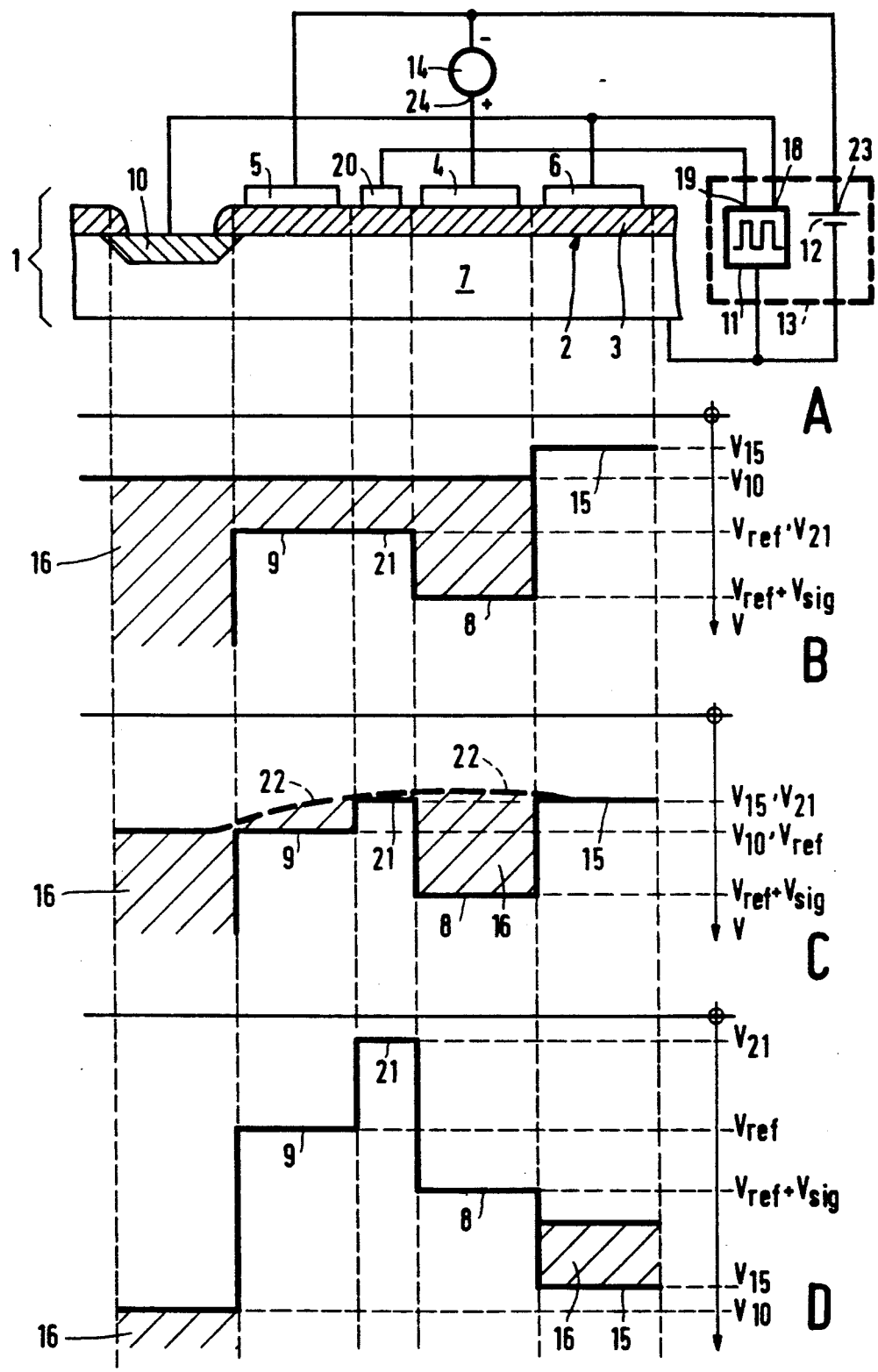

In FIG. 2 corresponding items have been given the same reference numerals as their counterparts in FIG. 1. The embodiment of the invention shown in FIG. 2A differs from the known apparatus shown in FIG. 1A in that a comparatively short (in the direction from electrode to electrode) fourth electrode 20 is provided on the insulating layer 3 between the electrode 5 and the electrode 4, and clock pulse generator 11 is provided with a second output 19 which is connected to electrode 20. The clock pulses produced at output 19 are in antiphase to those produced at output 18 and the resulting voltages on electrode 20 cause a third potential barrier to be created in the part of region 7 under electrode 20, i.e. between the first potential barrier created under electrode 5 and the metering potential well created under electrode 4. This will now be described with reference to FIGS. 2B-2D which illustrate stages in the operation of the embodiment of FIG. 2A corresponding to the stages in the operation of the known apparatus of FIG. 1A illustrated in FIGS. 1B-1D.

Comparison of FIG. 2B with FIG. 1B reveals no difference. This is because it has been assumed that the high (most positive) level of the clock pulses applied to electrode 20 is chosen relative to the output voltage of source 12 such that the height $V_{21}$ of the potential barrier 21 created under electrode 20 in the situation of FIG. 2B is substantially equal to the height $V_{ref}$ of the potential barrier 9 under electrode 5. This is preferably but not necessarily the case. The height of barrier 21 may in fact be lower (more positive), but should not be higher (more negative) than the height of barrier 9 in this situation.

Comparison of FIG. 2C with FIG. 1C reveals that in FIG. 2C electrode 20 has created a potential barrier 21 between barrier 9 and metering well 8, the barrier 21 being higher (more negative) than the barrier 9. (In fact the height $V_{21}$ of barrier 21 is shown equal to the height of barrier $V_{15}$ at the relevant time but this in general will not be the case). The potential profile in the region 7 under the region 10 and the electrodes 5,20,4 and 6 may be as indicated by the dashed line 22 in this situation, i.e. such that barrier 21 is already preventing the transfer of charge between the parts of region 7 lying under electrodes 5 and 4, as required (c.f. line 17 in FIG. 1C where such transfer is far from cut-off).

In the situation illustrated in FIG. 2D the potential barrier 21 is very high (hardly positive at all) but has no effect on the operation of the apparatus because the parts of region 7 under region 10 and electrode 6 are in any case isolated from each other by the potential barriers 8 and 9. However, during the transition from the situation illustrated in FIG. 2C to the situation illustrated in FIG. 2D the increasing height of the barrier 21 acts to urge the electrons in the part of region 7 lying under electrode 4 towards the part lying under the electrode 6, which can be beneficial in its own right.

Referring once again to the ideal situations illustrated in FIGS. 1B-1C it will be appreciated that a basic principle of known so-called "fill and spill" sampling methods is that a metering potential well 8 is initially overfilled with charge carriers over a potential barrier 9. The surplus carriers are then subsequently drained or spilled back over the potential barrier so that the voltage level in the well 8 becomes fixed accurately at the level of the barrier 9, thereby making the quantity of charge remaining in the well 8 accurately proportional to the instantaneous value $V_{sig}$ of the input signal (or to a constant plus this value if there is an effective or actual d.c. offset between the depth of the well 8 in the absence of an input signal and the height of the barrier 9); c.f. FIG. 1C. If reference is now made to FIG. 2C, it might appear that this accurate fixing of the voltage level in the well 8 has been lost as the draining of carriers into the region 10 is terminated before the level in the well 8 has reached $V_{ref}$, only partial spill-back has occurred (as indeed also occurs with the known apparatuses at high clock frequencies; c.f. FIG. 1C). However, further consideration reveals that this loss has not in fact taken place. All that is really required is that an accurately defined amount of surplus charge carriers is drained or spilled back into the region 10 each time. Whether this is such as to leave the potential in well 8 accurately equal to $V_{ref}$ or to a higher (less positive) value is immaterial, as the latter case will merely give rise to a d.c. offset at the output. It has been found that, provided the clock pulse waveform is stable, the simultaneous increase in the height of the barrier 21 (in the less positive i.e. more negative direction) and the lowering of the potential of region 10 (in the more positive i.e. less negative direction) can give rise to the draining or spilling back of an amount of charge carriers which is sufficiently accurately defined each time for many applications, and in particular is substantially independent of the value of the analog voltage from source 14 at the relevant time.

The sampling apparatus described with reference to FIG. 2 may constitute the charge input section of a charge transfer device, for example, a charge coupled delay device. Such delay devices are well known per se and may employ two-phase, three-phase or even more phase transfer electrode structures (see, for example, pages 19–42 of the book "Charge Transfer Devices" by Séquin and Tempsett, 1975). If the apparatus described with reference to FIG. 2 is used as the charge input section of a charge-coupled delay device employing a two-phase transfer electrode structure (in which case the electrode 6 will form at least a part of the first half of the first transfer cell) the two output signals of the clock pulse generator 11 may also be used as the two phases controlling the relevant transfer electrodes. The input section, the first few transfer electrodes, and the various interconnections between the electrodes of an example of a slightly modified such device are shown very diagrammatically in FIG. 3 of the drawings.

Figure 3:
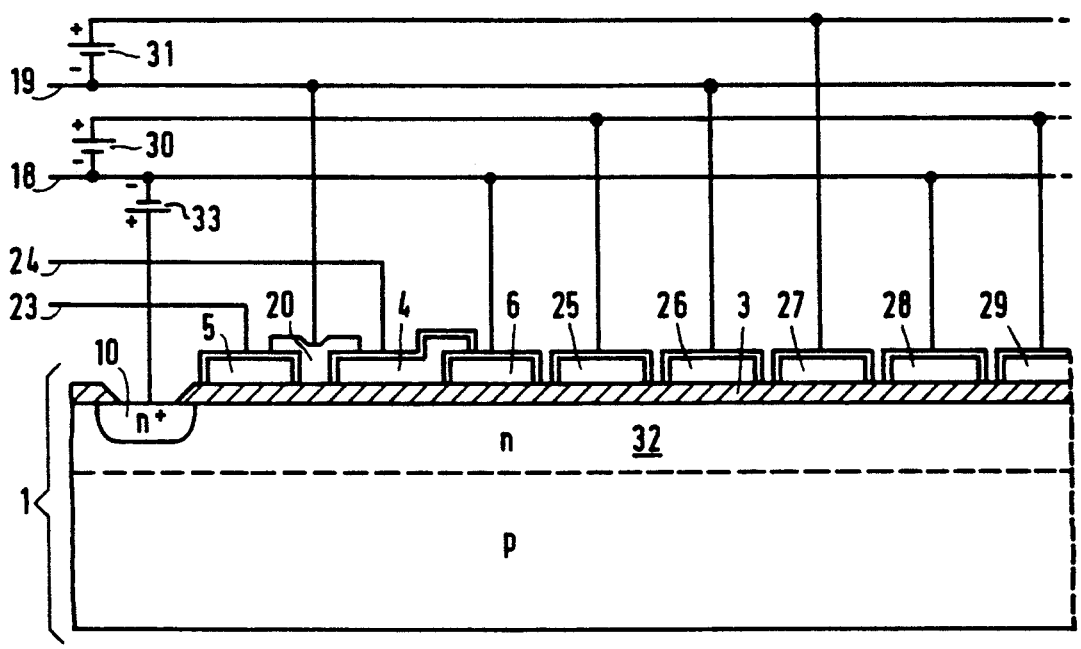
FIG. 3 illustrates a second embodiment of the invention.

In FIG. 3 the electrode 6 (c.f. FIG. 2A) together with an electrode 25 forms the first half of the first transfer cell of the device, and electrodes 26 and 27 form the second half. Similarly electrodes 28 and 29 form the first half of the second transfer cell. The first electrode of the first half of each transfer cell is connected to the output 18 of the clock pulse generator 11 of FIG. 2 and the second electrode of the first half of each transfer cell is connected to the output 18 via a voltage source 30. Similarly the first electrode of the second half of each transfer cell is connected to the output 19 of the clock pulse generator 11 of FIG. 2 and the second electrode of the second half of each transfer cell is connected to the output 19 via a voltage source 31. The electrodes 4 and 5 are connected to the output 24 of analog signal source 14 (FIG. 2A) and the output 23 of bias voltage source 12, respectively. The region 10 is connected to the output 18 of clock pulse source 11 via a d.c. voltage source 33. In contrast to the device of FIG. 2 the delay device of FIG. 3 is of the buried channel type and, in consequence, the p-type charge transfer channel region 7 of the (silicon) semiconductor substrate 1 of FIG. 2 has been replaced by an n-type charge transfer channel region 32 interspersed between the basically p-type material of substrate 1 and the insulating oxide layer 3. Charge transport is, as is usual with bulk channel devices, within the region 32 and the transported charges are again electrons, i.e. majority charge carriers in this case. In a particular implementation the basically p-type material of substrate 1 was doped with acceptor atoms to a concentration of $5 \times 10^{14}$ per cubic centimeter and the n-type region 32 was doped with donor atoms the concentration of which was graded from $5 \times 10^{15}/cm^3$ where region 32 adjoins the insulating layer 3 to substantially zero where region 32 adjoins the p-type material of substrate 1. The region 32 was 2 μm thick. The charge carrier source region 10 was doped n+ and the lengths of the (oxidised polysilicon) electrodes 5,20,4 and 6 (in the direction from one electrode to the next) were 3 μm, 0.8 μm, 3.5 μm and 3 μm respectively, the spacing between the (oxide-coated) electrodes 5 and 4 being 1.8 μm and the thickness of the oxide layer 3 being 0.1 μm. The output voltages of the d.c. voltage sources 30,31 and 33 were 2 V, 2 V and 8 V respectively, the output voltage of source 12 was 5 V relative to region 7, and the clock pulses generated by source 11 had peaks situated at 0 V and +6 V respectively relative to region 7. This implementation was capable of a sampling bandwidth of approximately 1 GHz and less than 1% non-linearity.

It is of course not essential that apparatuses according to the invention be employed as charge input sections of charge transfer devices. They may, if desired, be employed purely as sample-and-hold apparatuses. Thus, for example, the apparatus described with reference to FIG. 3 may be modified by replacing gate electrode 27 by an n+ diffusion similar to diffusion 10, dispensing with the gate electrodes 28,29 . . . and the voltage source 31, and replacing the connection from 19 to the gate electrode 26 by a connection from electrode 26 to the output of a d.c. voltage source which thereby biasses electrode 26 positively relative to the basically p-type substrate 1 and in doing so causes electrode 26 to operate as a d.c. gate electrode similar to electrode 5. If this is done the n+ diffusion replacing gate electrode 27 will operate as a drain electrode and may be connected to the input of a current or voltage sense amplifier such as is commonly employed as a charge-coupled device output amplifier. The apparatus described with reference to FIG. 2 may be employed in a similar manner.

Although the embodiments of the invention described all employ basically p-type semiconductor bodies with an n-type charge carrier source region and a p-type or n-type charge carrier transport channel region, it will be evident that it is also applicable to semiconductor bodies which are basically n-type with a p-type source region and an n-type or p-type channel region, it merely being necessary to reverse the polarity of the various bias, clock pulse, and analog voltage sources employed. In all cases the length of the fourth electrode 20 (in the direction from electrode 5 to electrode 4) is preferably as small as the technology employed allows, in order to minimise the amount of charge partitioned on either side of the corresponding potential barrier as the height of this barrier increases during the falling edge of each clock pulse applied to electrode 20.

In all of the embodiments described the charge carriers may be laterally confined within the charge transport channel in conventional manner, e.g. by means of a field shield electrode, oxide step, or channel stop diffusion. Such means have not been shown in the drawings, for the sake of clarity and simplicity.

From reading the present disclosure, other modifications will be apparent to persons skilled in the art. Such modifications may involve other features which are already known in the design, manufacture and use of sampling apparatuses and methods and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

We claim:

1. Apparatus for sampling an analogue signal voltage to provide charge packets representative of successive samples, said apparatus comprising: a semiconductor substrate of a given conductivity type and adjacent a surface of which a charge carrier source region of opposite conductivity type is provided and a channel region for transporting charge carriers from said source region is defined, said channel region having the given or the opposite conductivity type and having a plurality of gate electrodes insulatingly overlaying it for controlling the charge carrier transport, said electrodes including a first gate electrode for forming a metering potential well within said channel region, a second gate electrode for forming a first potential barrier within said channel region between said metering potential well and said source region, and a third gate electrode for controlling the transfer of charge packets from said metering potential well towards an output, an input for said analogue signal voltage, coupled to said first gate electrode, and a control signal generator coupled to said source region and to said first, second and third gate electrodes for applying a bias voltage in conjunction with said analogue signal voltage to said first gate electrode so as to create said metering potential well, for applying a bias voltage to said second gate electrode so as to create said first potential barrier, and for applying clock signals having substantially the same phase to both said source region and said third gate electrode to control the potentials of the source region and the third gate electrode between (a) values at which said metering potential well will be filled over said first potential barrier with charge carriers from said soruce region to a level determined by the potential of said source region and said third gate electrode will create a second potential barrier acting to prevent said charge carriers from leaving said metering potential well, and (b) values at which said first potential barrier will act to prevent charge carriers entering the metering potential well from said source region and said third gate electrode will no longer create a potential barrier acting to prevent charge carriers from leaving said metering potential well, characterized in that said plurality of gate electrodes includes a fourth gate electrode for forming a third potential barrier within said channel region between said metering potential well and said first potential barrier, and in that said control signal generator is coupled to said fourth gate electrode for applying a clock signal thereto substantially in antiphase to the clock signals applied to the source region and the third gate electrode to control the potential of said fourth gate electrode between a first value at which the third potential barrier is at least as low as said first potential barrier and a second value at which the third potential barrier is higher than said first potential barrier.

2. Apparatus as claimed in claim 1, wherein the length of said fourth gate electrode is small compared with the lengths of the first and second gate electrodes.

3. Apparatus as claimed in claim 2, wherein said third gate electrode constitutes a first electrode of a two-phase charge transfer gate electrode structure in which respective sets of further electrodes of the charge transfer gate electrode structure are connected to said third gate electrode and said fourth gate electrode for receiving corresponding clock signals.

4. Apparatus as claimed in claim 1, wherein said third gate electrode constitutes a first electrode of a two-phase charge transfer gate electrode structure in which respective sets of further electrodes of the charge transfer gate electrode structure are connected to said third gate electrode and said fourth gate electrode for receiving corresponding clock signals.

5. An apparatus as claimed in claim 1, wherein said fourth gate electrode insulatingly overlies said channel region and is located between said first and second gate electrodes.

6. A method of sampling an analogue signal voltage to provide charge packets which are representative of successive samples, in which method a charge carrier source region of a given conductivity type provided within and adjacent a surface of a semiconductor substrate of the opposite conductivity type and a plurality of gate electrodes which insulatingly overly a charge carrier transport channel region of the given or the opposite conductivity type defined within said substrate adjacent said surface for controlling the transport of charge carriers from said source region through said channel region are controlled in a manner such that a metering potential well the depth of which depends on said analogue signal voltage is created in said channel region by means of a first gate electrode, creating a first potential barrier in said channel region between said well and said source region by means of a second said gate electrode, creating a second potential barrier in said channel region adjacent said metering potential well by means of a third said gate electrode, and controlling said source region and said third gate electrode by clock pulses having substantially the same phase so that alternately (a) said metering potential well is filled over said first potential barrier with charge carriers from said source region to a potential level determined by the then potential of said source region while the second potential barrier is maintained sufficiently high to prevent such carriers from the source region from leaving the well, and (b) charge carriers are drained back from the well into the source region over the first potential barrier and, substantially simultaneously, the second potential barrier is lowered to allow charge carriers remaining in the well to leave the well towards an output, and creating a third potential barrier between the first barrier and the well by means of a fourth said gate electrode by controlling the fourth gate electrode with clock pulses so that the third barrier is alternately raised and lowered substantially simultaneously with the lowering and raising of the second barrier, the height of said third barrier being at least as low as said first potential barrier when said third barrier is in its lowered state and being higher than said first potential barrier when said third barrier is in its raised state.

* * * * *